United States Patent [19]

Nakajima

[11] Patent Number: 5,793,118

[45] Date of Patent: Aug. 11, 1998

[54] SEMICONDUCTOR DEVICE CAPABLE OF ACCOMPLISHING A HIGH MOISTURE PROOF

[75] Inventor: Hirofumi Nakajima, Tokyo, Japan

[73] Assignee: NEC Corporation, Tokyo, Japan

[21] Appl. No.: 916,824

[22] Filed: Aug. 22, 1997

Related U.S. Application Data

[63] Continuation of Ser. No. 449,493, May 24, 1995, abandoned.

[30] Foreign Application Priority Data

May 26, 1994 [JP] Japan ..................... 6-134885

[51] Int. Cl.$^6$ ............. H01L 23/29; H01L 23/28; H01L 23/10; H01L 23/34
[52] U.S. Cl. ............. 257/790; 357/787; 357/790; 357/793; 357/706; 438/15; 438/106; 438/127
[58] Field of Search .................... 257/738, 787, 257/790, 797, 796, 678, 779, 666, 788, 708, 793; 438/15, 28, 106, 127, 384, 380

[56] References Cited

U.S. PATENT DOCUMENTS

| 4,026,008 | 5/1977 | Drees et al. ............... 257/666 |
| 5,083,191 | 1/1992 | Ueda ......................... 257/668 |
| 5,090,609 | 2/1992 | Nakao et al. ............... 228/123 |
| 5,216,278 | 6/1993 | Lin et al. ................... 257/688 |
| 5,345,106 | 9/1994 | Doering et al. ............ 257/666 |

FOREIGN PATENT DOCUMENTS

| 0463559 A3 | 6/1991 | European Pat. Off. . |
| A 57-096559 | 6/1982 | Japan . |
| 57-130437 | 8/1982 | Japan . |
| 58-23063 | 8/1984 | Japan . |
| 2 164794 | 3/1986 | United Kingdom . |

Primary Examiner—Mahshid D. Saadat
Assistant Examiner—Jhihan B. Clark
Attorney, Agent, or Firm—Foley, Hoag & Eliot LLP

[57] ABSTRACT

In a method of manufacturing a semiconductor device including a semiconductor element and a chip carrier which has conductive leads bonded to the semiconductor element, a first resin mold portion is formed by a first resin mold portion to locate inner parts of the conductive leads together with the semiconductor element within the first resin mold portion. Thereafter, a second resin mold portion is formed to cover the first resin mold portion on a side of the semiconductor element and to uncover the first resin mold portion on another side opposite to the semiconductor element. Alternatively, a heat spreader may be attached to the semiconductor element and may be sealed by the first and the second resin mold portions.

12 Claims, 5 Drawing Sheets

SEMICONDUCTOR DEVICE CAPABLE OF ACCOMPLISHING A HIGH MOISTURE PROOF

This application is a continuation of application Ser. No. 08/449,493, filed May 24, 1995, now abandoned.

BACKGROUND OF THE INVENTION

This invention relates to a semiconductor device which has a semiconductor element sealed by a synthetic resin (will be simply called a resin hereinunder) and mounted on a chip carrier, such as a tape carrier.

As a rule, it is a recent trend that a semiconductor device becomes small in size, thin in thickness, and light in weight. In order to be matched with this trend, automation has been made also as regards an assembling process of mounting a semiconductor element or chip onto a package which has a plurality of wiring patterns or outer leads on a package surface. Since the semiconductor element is mounted or attached onto the package surface of the package, the above-mentioned assembling process is referred to as a surface mounting method in the art. The surface mounting method has been usually adopted in a semiconductor device of a Quad Flat Package (QFP) structure or a Small Outline J-leaded Package (SOJ) structure.

Herein, it is to be noted that the outer leads are located along an outer periphery of the package and are one-dimensionally extended and that they are electrically connected to electrodes of the semiconductor elements by the use of conductive wires one by one.

With this structure, a spacing or a pitch between two adjacent ones of the electrodes of the semiconductor element becomes narrow as the electrodes are increased in number. Such a narrow pitch makes a mounting process difficult when the pitch becomes narrow over a limit of a mounting technique.

On the other hand, a semiconductor device has been proposed in U.S. Pat. No. 5,216,278 issued to Paul T. Lin et al and has a package structure known as a Ball Grid Array (BGA). With this structure, it is possible to derive wiring patterns two-dimensionally from the electrodes of the semiconductor element arranged two-dimensionally in the form of pads on the semiconductor element.

More specifically, the package structure comprises a carrier substrate of a flexible material, such as a resin material, which has a die attach surface and a package mounting surface opposite to the die attach surface. A semiconductor element which has a plurality of pads is bonded to the die attach surface through a conductive layer. Any other package leads are arranged around the semiconductor element on the die attach surface and are electrically connected to the pads on the semiconductor element through conductive lines. Some of the package leads are electrically connected through via holes to package leads formed on the package mounting surface.

A plurality of solder balls are placed on the package leads on the package mounting surface to be attached to a printed circuit board. Thus, a combination of the carrier substrate and the package leads on the die attach surface and the package mounting surface may be collectively called a chip carrier.

Furthermore, the semiconductor element on the die attach surface of the carrier substrate is sealed or molded by a resin material.

With this structure, the resin material is formed only on a side of the die attach surface of the carrier substrate. This shows that the resin material is adhered to the chip carrier only on a side of the die attach surface with a side of the package mounting surface uncovered with the resin material.

Consequently, the resin material is fixed to the chip carrier only by adhesion of the resin material.

Herein, it is to be noted that the resin material is liable to absorb moisture and has a thermal expansion coefficient different from that of the chip carrier. In addition, the carrier substrate itself has a high hygroscopicity.

Moreover, such a semiconductor device of the type described is heated on mounting the semiconductor device onto the printed circuit board so as to melt the solder balls and to attach the semiconductor device to electrodes laid on the printed circuit board.

Under the circumstances, the semiconductor device is disadvantageous in that the resin material is easily peeled from the chip carrier when the semiconductor device is heated on mounting the semiconductor device onto the printed circuit board. This is because evaporation of moisture takes place in the resin material by a heat treatment on mounting the semiconductor device onto the printed circuit board and the resin material is largely expanded in comparison with the chip carrier.

Taking the above into consideration, the resin material is dried within an oven to eliminate the moisture before the semiconductor device is mounted onto the printed circuit board. Thus, the semiconductor device should be deliberately handled in order to prevent the resin material from being peeled from the chip carrier. As a result, the semiconductor device is troublesome in handling.

Furthermore, the semiconductor device is degraded in characteristics and can not be guaranteed in a long term reliability because the semiconductor device is directly bonded on the chip carrier which has a high hygroscopicity and is also not sealed by a resin material.

In addition, since the conductive lines are used to electrically connect the pads of the semiconductor element to the leads, a pitch between two adjacent ones of the pads should be equal to or wider than 120 micron meters. As a result, it is difficult with the above-mentioned method to mount, on the chip carrier, a semiconductor element which has a pitch narrower than 120 micron meters.

The semiconductor device also has disadvantages that bonding strength of connections is weak between the leads and the conductive lines, because the leads are formed by copper which is soft and which can not be heated to a high temperature.

Moreover, long electrical paths are required between the pads of the semiconductor element and the printed circuit board, which results in a long transmission delay time and a large noise.

SUMMARY OF THE INVENTION

It is an object of this invention to provide a semiconductor device which is capable of removing disadvantages enumerated above.

It is a specific object of this invention to provide a semiconductor device of the type described, which can prevent a resin material from being peeled from a chip carrier.

It is another object of this invention to provide a semiconductor of the type described, which can guarantee a long term reliability.

It is still another object of this invention to provide a semiconductor of the type described, which can reduce noise and shorten a transmission delay time.

According to an aspect of this invention, a semiconductor device comprises a chip carrier which has a front surface and a back surface opposite to the front surface and which is formed by a resin substrate and a plurality of leads attached to the resin substrate on the front surface, a semiconductor element having a principal element surface electrically connected to the leads and a bottom element surface opposite to the principal element surface, a first mold resin portion which covers the semiconductor element on both sides of the front and the back surfaces of the chip carrier together with a part of the leads adjacent to the semiconductor element to seal the semiconductor element within the first mold resin portion, and a second mold resin portion which covers the first mold resin portion on a side of the back surface of the chip carrier.

According to another aspect of this invention, a method is for use in manufacturing a semiconductor device which comprises a chip carrier and a semiconductor element mounted on the chip carrier. The method comprises the steps of sealing the semiconductor element by a mold resin to form a first mold resin portion and sealing a part of the first resin portion by another mold resin to form a second mold resin portion and to obtain the semiconductor device.

DESCRIPTION OF THE PREFERRED EMBODIMENTS

Figure 1:
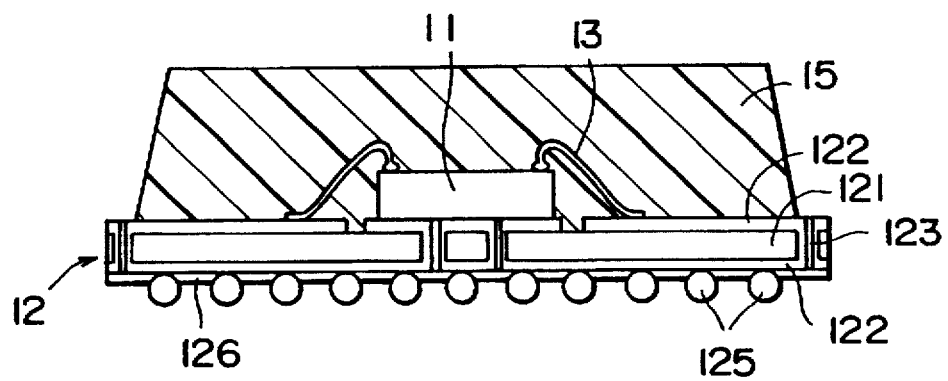
FIG. 1 is a sectional view of a conventional semiconductor device.

Referring to FIG. 1, description will be at first made about a conventional semiconductor device which is substantially equivalent to that described in U.S. Pat. No. 5,216,278 referenced in the preamble of the instant specification. The conventional semiconductor device has been called a ball grid array semiconductor device of a plastic or resin seal type and comprises a semiconductor element or chip 11 and a chip carrier 12.

The semiconductor element 11 has an upper element surface, a lower element surface, and a plurality of pads which serve as electrodes and which are formed on the upper surface of the semiconductor element 11, as shown in FIG. 1. The upper element surface may be called a principal element surface while the lower element surface may be called a bottom element surface.

The chip carrier 12 comprises a plastic or resin substrate 121 of, for example, a glass epoxy resin material having a die attach surface and a package mounting surface directed upwards and downwards of FIG. 1, respectively. A plurality of conductive leads (will be simply called leads hereinafter) 122 are located or arranged on both the -die attach surface and the package mounting surface of the resin substrate 121. Each of the leads 122 is formed by a copper foil. Some of the leads 122 on the die attach surface are electrically connected to the other leads 122 on the package mounting surface through via holes 123. In addition, an electrode is also placed on the die attach surface to support the semiconductor element 11.

A plurality of solder balls or bumps 125 which serve as external terminals are formed on the leads 122 attached to the package mounting surface of the resin substrate 121 and are surrounded by a solder mask 126 which serves to define locations of the solder balls 125.

As shown in FIG. 1, the semiconductor element 11 rests on the electrode formed on the die attach surface of the resin substrate 121 and the pads of the semiconductor element 11 are electrically connected through bonding wires 13 of Au to the leads 122 formed on the die attach surface. As a result, the pads of the semiconductor elements 11 are electrically connected to the solder balls 125.

The semiconductor element 11 is molded by the use of a resin material 15 which is formed on a side of the die attach surface and which will be called a resin mold hereinunder.

From the above, it is readily understood that the resin mold 15 is attached only to the die attach surface side alone and that the pads of the semiconductor device are directed upwards of FIG. 1. Therefore, the illustrated semiconductor device has shortcomings as pointed out in the preamble of the instant specification.

Referring to FIGS. 2(A) to (F), a semiconductor device according to a first embodiment of this invention will be described in the order of manufacturing processes. In FIG. 2(A), a semiconductor element or chip 11 is at first prepared which has a principal element surface directed downwards of FIG. 2(A), a bottom element surface directed upwards, and a plurality of bumps 11a on the principal element surface. Each of the bumps 11a is composed of Au in the illustrated example.

On the other hand, a chip carrier 12 is also prepared which comprises a resin or plastic substrate 121 of, for example, polyimide, epoxy. The resin substrate 121 has a die attach surface and a package mounting surface which will be called a back surface and a front surface directed upwards and downwards of FIG. 2, respectively. In this connection, the back and the front surfaces may be referred to as upper and lower surfaces, respectively.

Figure 2:
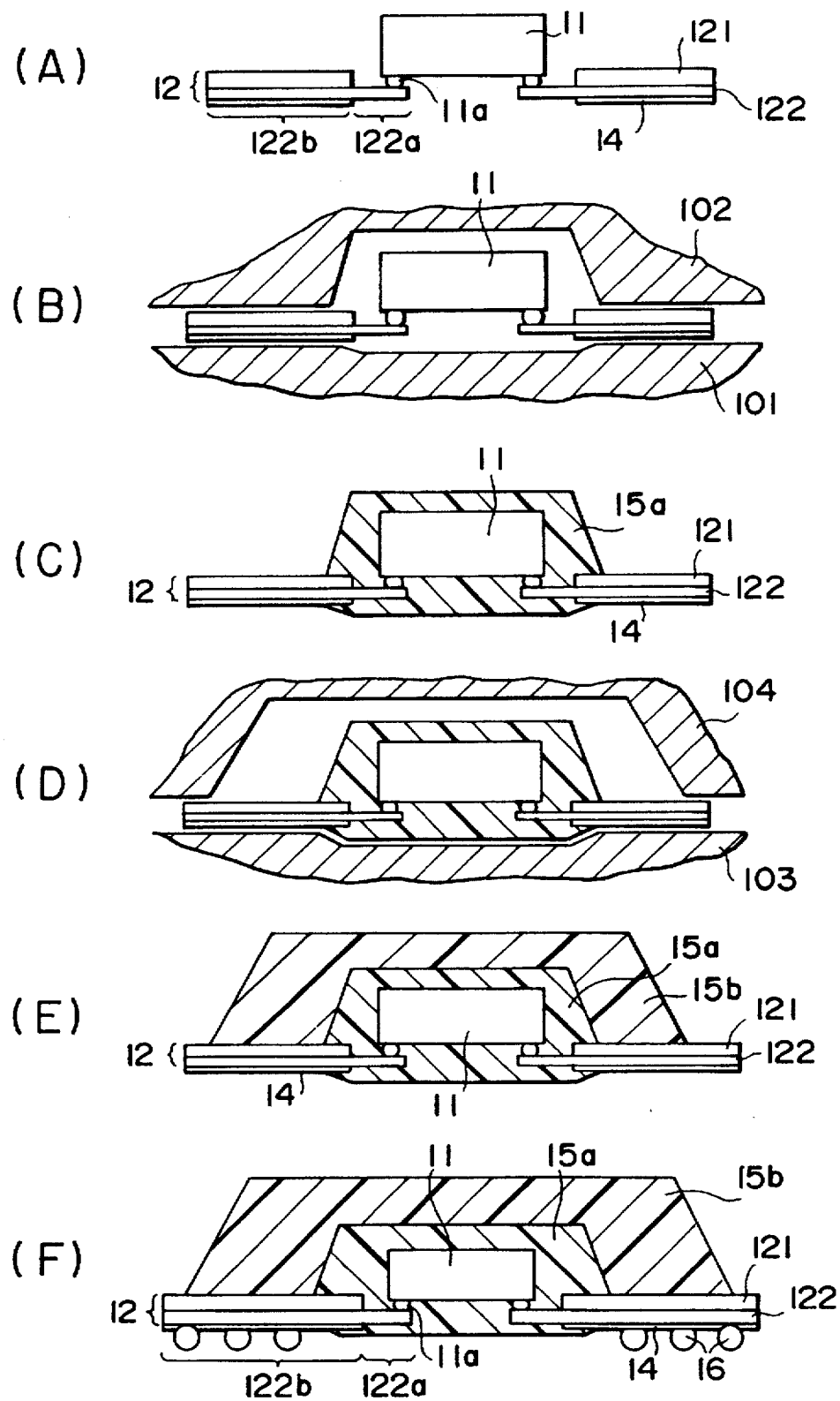
FIGS. 2(A) to 2(F) are sectional views for use in describing processes of manufacturing a semiconductor device according to a first embodiment of this invention in order.

Inside the resin substrate 121, a device hole is defined so as to mount the semiconductor element 11 within the device hole in a manner to be described later, as illustrated in FIG. 2 (A).

In addition, the chip carrier 12 comprises a plurality of leads 122 of copper which are attached to the resin substrate 121 and each of which is divided into an inner lead 122a extended inwards of the device hole and an outer lead 122b placed outside of the inner lead 122a. Each outer lead 122b is supported on the front surface of the resin substrate 121. A solder mask 14 is formed on the lower surface of each outer lead 122b, as shown in FIG. 2(A). The solder mask 14 has a plurality of holes for solder balls or bumps (will be described later). Thereafter, a mass of metal, such as Sn or Au, is plated on each inner lead 122a and in each hole. As a result, land portions for the solder balls are provided by plated portions in the holes. At any rate, the chip carrier 12 is completed in the above-mentioned manner.

With this structure, the semiconductor element 11 is bonded to the inner leads 122a by the use of bumps 11a on the upper surface of the resin substrate 121. For example, the semiconductor element 11 may be bonded to the inner leads 122a by a face down bonding technique, namely, a gang bonding method. Thus, adaptation of the gang bonding method makes it possible to shorten a bonding time. Such an effect of shortening the bonding time becomes distinct as the number of the bumps 11a is increased.

In FIG. 2(B), the semiconductor element 11 and the chip carrier 12 mentioned above are introduced into a mold which is composed of a first lower mold 101 and a first upper mold 102 and which is included in a transfer mold apparatus. The first lower mold 101 has a center portion and a peripheral portion which surrounds the center portion. The center portion is recessed downwards of FIG. 2(B) relative to the peripheral portion while the peripheral portion is flat and is brought into contact with each outer lead 122b, as illustrated in FIG. 2(B).

On the other hand, the first upper mold 102 has a peripheral region attached to the each outer lead 122b of the chip carrier 12 and a center region elevated from the peripheral region. The center portion of the first lower mold 101 and the center region of the first upper mold 102 define an inner space or a cavity for accommodating the semiconductor element 11 and a part of the chip carrier 12.

Under the circumstances, the outer leads 122b are cramped by the first upper and the first lower molds 102 and 101 with the semiconductor element 11 and the inner leads 122a enveloped within the cavity between the first upper and the first lower molds 102 and 101. In this situation, a first molding process is conducted by causing molten resin to flow within the cavity. As a molding or sealing resin, an epoxy resin which is a kind of cresol novolak resins is used while a phenol novolak resin is used as a hardening agent. In addition, silica is used as a filler to improve a thermal radiation characteristic.

After the resin is hardened, a provisional semiconductor device as shown in FIG. 2(C) is taken out of the transfer mold apparatus. Thus, it is possible to obtain the provisional device sealed by a first mold resin portion 15a.

Herein, it is to be noted that the first mold resin portion 15a covers not only the semiconductor element 11 but also a lower surface of each inner lead 122a together with a lower surface of a part of each outer lead 122b without any fins. This is because the first upper and the first lower molds 102 and 101 are closely attached to the chip carrier 12 without any gap. Thus, the first mold resin portion 15a envelopes the chip carrier 12 on both sides of the back and the front surfaces. In this event, the first mold resin portion 15a on the first surface of the chip carrier 12 may be called a first part while the first mold resin portion 15a on the back surface, a second part.

Thereafter, the provisional semiconductor device is introduced into a second mold device which is composed of a second lower mold 103 and a second upper mold 104 and which is included in another transfer mold apparatus. The second lower mold 103 has a center portion recessed relative to a peripheral portion and is attached to the chip carrier 12 and the first mold resin portion 15a on both lower sides of the chip carrier 12 and the first mold resin portion 15a.

On the other hand, the second upper mold 104 has an inside cavity defined by a peripheral contact surface, an inside side wall contiguous to the peripheral contact surface, and an inside center surface contiguous to the inside side surface. The peripheral contact surface is brought into contact with the upper surface of the chip carrier 12.

Within the inside cavity formed between the second lower mold 103 and the second upper mold 104, the provisional semiconductor device is introduced and is located, as illustrated in FIG. 2(D). Thereafter, the second lower mold 103 and the second upper mold 104 are closed to cramp a peripheral portion of the chip carrier 12. In this situation, a lower surface of the first mold resin portion 15a and a lower surface of the chip carrier 12 are contacted with the second lower mold 103 while the upper surface of the peripheral portion of the chip carrier 12 is contacted with the second upper mold 104.

Subsequently, molten resin is caused to flow within the inside cavity to carry out a second molding process so as to seal the provisional semiconductor device by the resin and to form a second mold resin portion 15b. The resin is identical with that used in the first molding process.

After the molten resin is hardened, a molded semiconductor device is taken out of the transfer mold apparatus and is sealed by the first and the second mold resin portions 15a and 15b, as shown in FIG. 2(E).

Furthermore, the semiconductor device is heated for several hours to cure the first and the second mold resin portions 15a and 15b.

Thereafter, solder balls 16 are formed on the land portions deposited on the outer leads 122b, as illustrated in FIG. 2(F). Such solder balls can be formed by soldering solder balls, by dripping molten solder by a disposer, or the like. The solder balls may be, for example, of an eutectic alloy of Pb and Sn.

Although the same resin is used for the first and the second mold resin portions 15a and 15b in the above-mentioned example, different resins may be used to form the first and the second mold portions 15a and 15b. In the latter case, it is necessary to select the resins which have thermal expansion coefficients similar to each other.

As illustrated in FIG. 2(F), the inner leads 122a are completely enveloped by the first mold resin portion 15a. In addition, an upper part of the first mold resin portion 15a is covered with the second mold resin portion 15b.

With this structure, it is possible to compensate for mechanical strength of the chip carrier 12 and to assure flatness of the outer leads 122b because the second mold resin portion 15b is formed onto the first mold resin portion 15a. In this event, an upper surface of the first mold resin portion 15a may not be always covered with the second mold resin portion 15b.

More specifically, since the semiconductor element 11 is completely enveloped by the first mold resin portion 15a, the illustrated semiconductor device can be remarkably improved in moisture proof. The first mold resin portion 15a can not be easily peeled from the chip carrier 12 because both upper and lower surfaces of the inner leads 122a are completely covered with the first mold resin portion 15a. A problem of peeling the first mold resin portion 15a from the inner leads 122a of the chip carrier 12 can be avoided or solved by improving the moisture proof of the chip carrier 11.

Practically, it has been found out in the semiconductor device illustrated in FIG. 2 that the first mold resin portion 15a is not peeled from the inner leads 122a even when the semiconductor device illustrated in FIG. 2(F) is mounted on a print circuit board after lapse of seventy-two hours, although the conventional semiconductor device illustrated in FIG. 1 should be mounted within twenty-four hours after it is dried in an oven.

Figure 3:
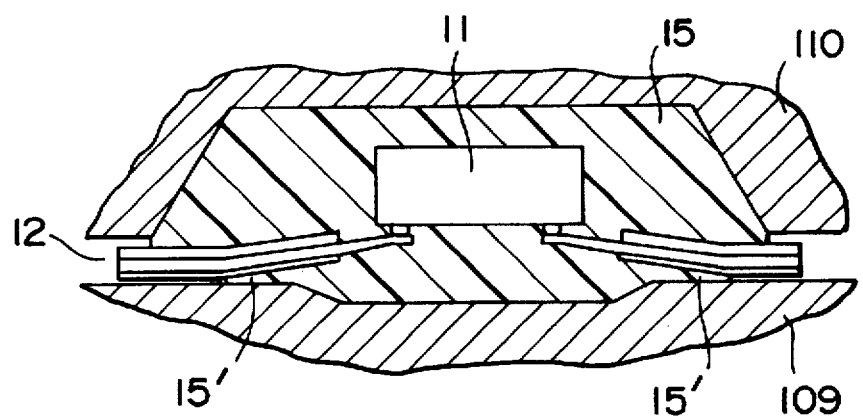
FIG. 3 is a sectional view for use in describing defects which occur in the conventional semiconductor device.

Herein, it is to be noted that none of fins take place on the first and the second mold resin portions 15a and 15b. Consideration will be made about the reasons why no fin takes place in the semiconductor device illustrated in FIG. 2. At first, let a semiconductor device as shown in FIG. 2(E) be manufactured by a single molding process. In this case, lower and upper molds which are similar to the second lower mold 103 and the second upper mold 104 (FIG. 2(D)) should be prepared, as illustrated in FIG. 3, and are depicted at 109 and 110 in FIG. 3. It should be noted that the lower mold 109 is brought into contact with the chip carrier at positions which are different from those of the upper mold 110 and that the lower mold 109 has a center portion recessed relative to a peripheral portion to form a cavity between the lower and the upper molds 109 and 110.

Under the circumstances, when molten resin is introduced into the cavity between the lower and the upper molds 109 and 110, the molten resin is caused to flow into the recessed portion of the lower mold 109 and to somewhat push up the chip carrier 12 upwards of FIG. 3. As a result, the chip carrier 12 is partially detached from the lower mold 109 by the molten resin, which brings about occurrence of a gap between the chip carrier 12 and the lower mold 109.

Thus, the molten resin is caused to flow into the gap between the the chip carrier 12 and the lower mold 109, as depicted at 15'. The resultant molten resin remains as resin fins on a resin mold portion 15.

On the other hand, when the first lower mold 101 and the first upper mold 102 illustrated in FIG. 2(B) are brought into contact with the chip carrier 12 at positions which are substantially opposed to each other. Accordingly, it is possible to avoid occurrence of the fins on the lower part of the first mold resin portion 15a, as shown in FIG. 2(C). Thereafter, the second mold resin portion 15b is formed on the upper part of the first mold resin portion 15a by the second molding process.

From this fact, it is readily understood that the first and the second molding processes serve to avoid occurrence of the fins and to prevent the first and the second mold resin portions 15a and 15b from being peeled from the chip carrier 12.

Figure 4:
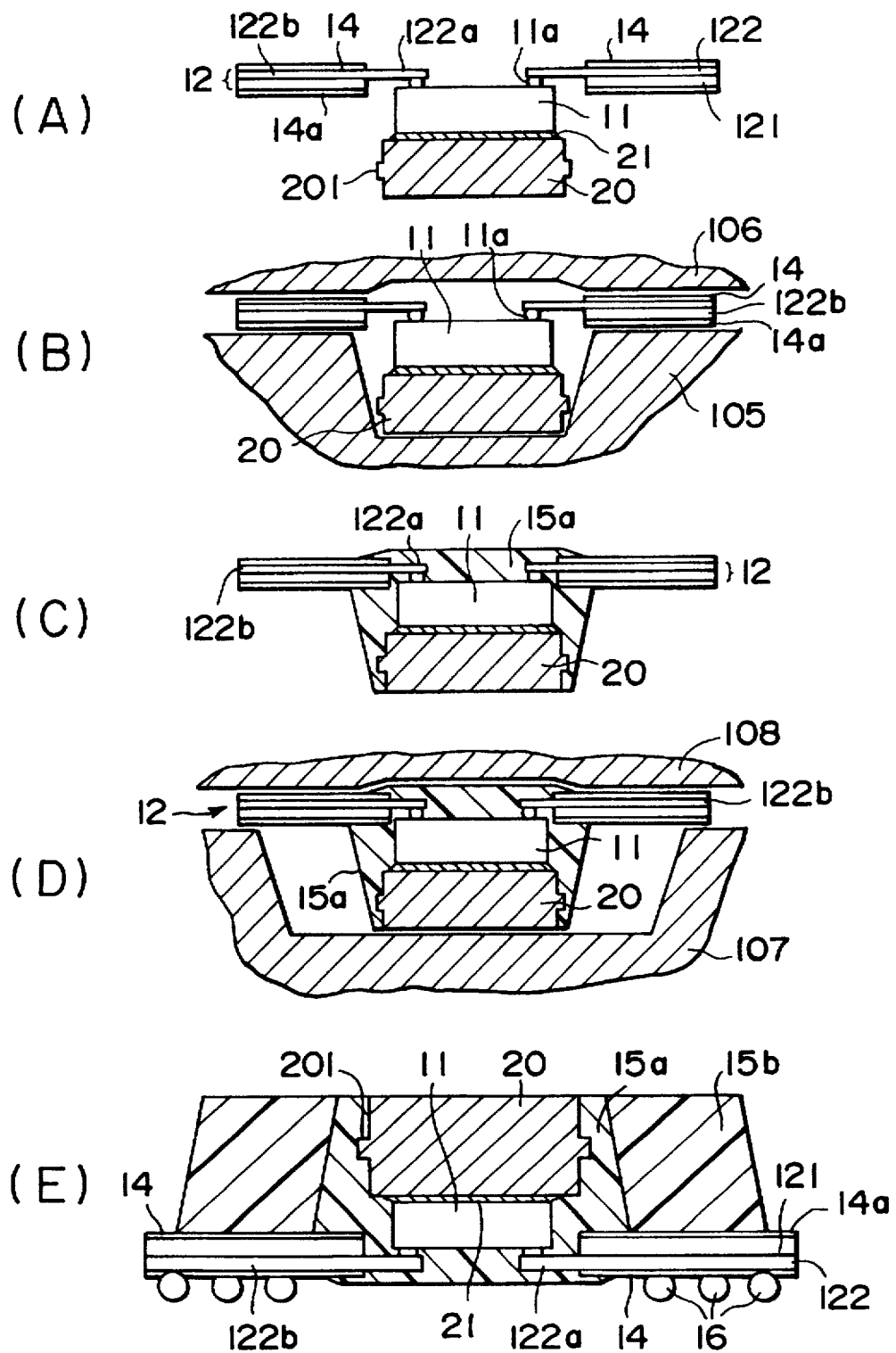
FIGS. 4(A) to 4(E) are sectional views for use in describing processes of manufacturing a semiconductor device according to a second embodiment of this invention.

Referring to FIGS. 4(A) to 4(E), a semiconductor device according to a second embodiment of this invention will be described in the order of manufacturing processes and comprises similar parts designated by like reference numerals. In FIG. 4(A), the semiconductor element 11 and the chip carrier 12 are prepared like in FIG. 2(A). Specifically, the illustrated semiconductor element 11 has front and back surfaces directed upwards and downwards of FIG. 4(A), respectively, and opposed to each other. The front surface of the semiconductor element 11 may be referred to as a principal element surface like in FIG. 2 while the back surface may be called a back element surface. A plurality of bumps 11a are formed on the principal element surface of the semiconductor element 11.

The chip carrier 12 includes the resin substrate 121 and the leads 122 of copper which are attached to the resin substrate 121 and which are divisible into inner leads 122a and outer leads 122b, like in FIG. 2. The inner leads 122a are extended inwards of the device hole of the resin substrate 121 while the outer leads 122b are coated with the solder mask 14 with the lands left therein. In the example being illustrated, a lower surface of the resin substrate 121 is also coated with a solder mask 14a which is effective to absorb stress imposed on a boundary face, as will become clear later.

Herein, it is noted that a heat spreader 20 is mounted on the back element surface of the semiconductor element 11 to spread or radiate heat from the semiconductor element 11 into an atmosphere. The illustrated heat spreader 20 has an upward surface, a downward surface opposite to the upward surface, and a side surface contiguous to the upward and the downward surfaces. The upward surface of the heat spreader 20 is attached onto the back element surface of the semiconductor element 11 by the use of silver paste which forms a silver paste layer 21. The side surface of the heat spreader 20 is projected outwards to form a projected portion 201.

Now, description will be made about processes of manufacturing the semiconductor device. The bumps 11a of the semiconductor element 11 are at first bonded onto the inner leads 122. Subsequently, the silver paste is coated on the upward surface of the heat spreader 20 to form the silver paste layer 21. Under the circumstances, the chip carrier 12 is reversed or upset with the semiconductor element 11 attached to the chip carrier 12. As a result, the chip carrier 12 and the semiconductor element 11 are put into a state as shown in FIG. 4(A). In this state, the semiconductor element 11 is located on the silver paste layer 21 coated on the heat spreader 20 and the silver paste is cured to attach the semiconductor element 21 to the heat spreader 20. Thus, an element unit illustrated in FIG. 4(A) is obtained which comprises the chip carrier 12, the semiconductor element 11, and the heat spreader 20.

In FIG. 4(B), the element unit is introduced within a transfer mold apparatus which comprises a first lower mold (depicted at 105 in FIG. 4(B)) and a first upper mold (depicted at 106 in FIG. 4(B)). The first lower mold 105 has a peripheral portion and a center portion which is recessed relative to the peripheral portion and which defines an inner space for accommodating the semiconductor element 11 and the heat spreader 20. The peripheral portion of the first lower mold 105 substantially supports the outer leads 122b through the resin substrate 121 and the solder mask 14a.

On the other hand, the first upper mold 106 has a peripheral region confronted with the peripheral portion of the first lower portion 105 and a center region elevated from the peripheral region of the first upper mold 106.

Thus, the first upper mold 106 is brought into contact with the solder mask 14 at an area which is substantially opposed to that of the first lower mold 105, when the first upper mold 106 and the first lower mold 105 are closed. In addition, the first lower mold 105 and the first upper mold 106 define an inner cavity which surrounds the inner leads 122a on both sides thereof.

After the element unit is introduced within the inner cavity between the first lower mold 105 and the first upper mold 106, the outer leads 122b are cramped by the first lower mold 105 and the first upper mold 106. In the example being illustrated, the downward surface of the heat spreader 20 is contacted with the center portion of the first lower mold 105.

Next, molten resin is caused to flow into the inner cavity to carry out a first mold process of the semiconductor element 11. After the molten resin is hardened, a molded element illustrated in FIG. 4(C) is taken out of the transfer mold apparatus.

As shown in FIG. 4(C), the molded element has a first mold resin portion 15a which covers side surfaces of the semiconductor element 11 and the heat spreader 20 with the downward surface of the heat spreader 20 exposed to the atmosphere. The first mold resin portion 15a covers both upper and lower sides of the inner leads 122a without any fins. This is because the opposite regions of the outer leads 122b are cramped by the first lower mold 105 and the first upper mold 106, as illustrated in FIG. 4(B).

Subsequently, the molded element is located within another transfer mold apparatus that comprises a second lower mold (depicted at 107 in FIG. 4(D)) and a second upper mold (depicted at 108).

As readily understood from FIG. 4(D), the second upper mold 108 has a center area contacted with an upper area of the first mold resin portion 15a and a peripheral area which can support the outer leads 122b. To this end, the center area of the second upper mold 108 is elevated relative to the peripheral area of the second upper mold 108.

On the other hand, the second lower mold 107 defines an inner lower space for accommodating the semiconductor element 11 and the heat spreader 20 and can support an outer peripheral portion of the chip carrier 12 and the heat spreader 20. Specifically, the inner lower space defined by the second lower mold 107 has a depth substantially equal to a height of the semiconductor element 11 and the heat spreader 20.

When the second lower mold 107 and the second upper, mold 108 are closed to cramp the molded element, the second lower mold 107 is attached to the outer peripheral portion of the chip carrier 12 and the downward surface of the heat spreader 20 while the se cond upper mold 108 is attached to the upper area of the first resin mold portion 15a and the chip carrier 12 on the outer leads 122b.

Under the circumstances, a second mold process is carried out by causing molten resin to flow into the inner cavity defined by the second lower mold 107 and the second upper mold 108. After the molten resin is hardened, a provisional semiconductor device is taken out of the transfer mold apparatus and comprises a second resin mold portion 15b covered on the first resin mold portion 15a. Thus, the provisional semiconductor device is sealed in double by the first and the second resin mold portions 15a and 15b.

After the provisional semiconductor device is heated for several hours to cure the first and the second resin mold portions 15a and 15b, the semiconductor device illustrated in FIG. 4(E) is obtained by forming a plurality of solder balls 16 on the outer leads 122b.

Herein, it is to be noted that the heat spreader 20 has the downward surface which is directed upwards of FIG. 4(E) and which is exposed to the atmosphere. Accordingly, heat from the semiconductor element 11 can be effectively radiated from the heat spreader 20.

In addition, the solder mask 14a is attached to the first and the second resin mold portions 15a and 15b in the illustrated example. The solder mask 14a serves to absorb stress imposed on the boundary face between the chip carrier 12 and each of the first and the second resin mold portions 15a and 15b and to improve adhesion between the resin substrate 121 and each of the first and the second resin mold portions 15a and 15b Moreover, since the projected portion 201 is formed on the side surface of the heat spreader 20 and lends itself not only to strongly couple the first resin mold portion 15a to the heat spreader 20 but also to prevent invasion of moisture which passes through a boundary face between the first resin mold portion 15a and the heat spreader 20. Such prevention of invasion of moisture can be accomplished by lengthening an invasion path by forming the projected portion 201. Therefore, a plurality of projected portions may be formed on the side surface of the heat spreader 20.

If an excellent moisture proof is required for the semiconductor device, the heat spreader 20 may be buried within a resin mold portion.

Figure 5:
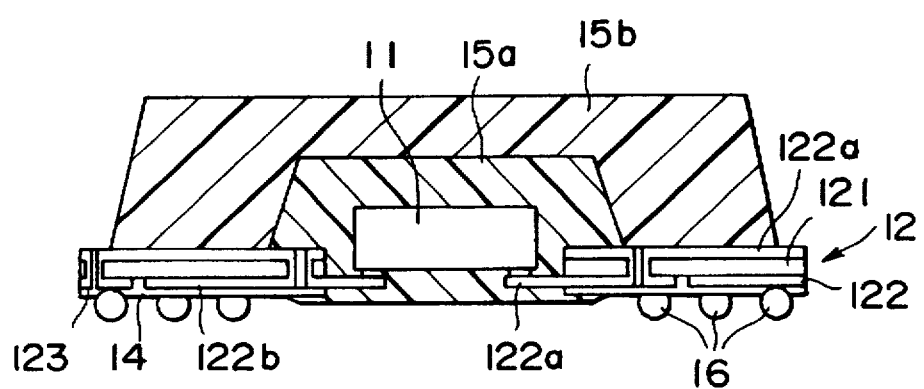
FIG. 5 is a sectional view of a semiconductor device according to a third embodiment of this invention.

Referring to FIG. 5, a semiconductor device according to a third embodiment of this invention is similar in structure to that illustrated in FIG. 2 except that leads 122 and 122a are formed on both surfaces of the resin substrate 121, as shown in FIG. 5. The leads 122 on one surface of the resin substrate 121 are electrically connected to the leads 122a on another surface of the resin substrate 121 through via holes 123.

Thus, the illustrated chip carrier 12 has a plurality of lead layers composed of the leads 122 and 122a and enables high density wiring. In addition, it is possible to increase a degree of freedom in relation to the wiring.

While this invention has thus far been described in conjunction with a few embodiments thereof, it will readily be possible for those skilled in the art to put this invention into practice in various other manners. For example, the solder balls 16 may be replaced by metallic balls, such as copper balls. The bumps 11a of the semiconductor element 11 may be formed by solder bumps. Moreover, the semiconductor element 11 may have no bump and, instead, aluminum pads formed on the semiconductor element. In this event, the aluminum pads are directly connected to the leads of copper by a tape automated bonding (TAB) technique. It is preferable that studs of copper are deposited on the inner leads of the chip carrier 12. At any rate, connections are made by an alloy of aluminum and copper.

Furthermore, the semiconductor element 11 may be coated with a bonding resin layer before the first mold process is carried out.

What is claimed is:

1. A semiconductor device comprising:

a chip carrier which has a front surface and a back surface opposite to said front surface and which is formed by a resin substrate and a plurality of leads attached to said resin substrate on said front surface, said resin substrate surrounding a device hole while the plurality of the leads have inner leads extended inside the device hole and outer leads laid on said resin substrate and extended outside the device hole; ended) A semiconductor device comprising:

a semiconductor element having a principal element surface electrically connected to the inner leads of said leads within said device hole and a bottom element surface opposite to said principal element surface;

a first mold resin portion which covers said semiconductor element on both said front and said back surfaces of said chip carrier together with the inner leads and a part of the outer leads to seal said semiconductor element within said first mold resin portion, said leads being substantially flat after being sealed; and a second mold resin portion which covers said first mold resin portion on a side of said back surface of the chip carrier.

2. A semiconductor device as claimed in claim 1, further comprising:

a plurality of balls attached to said leads and projected from said front surface of the chip carrier.

3. A semiconductor device as claimed in claim 1, wherein said semiconductor element has the principal element surface directed to said back surface of the chip carrier and a plurality of bumps which are projected from said principal element surface and which are electrically connected direct to said leads of the chip carrier.

4. A semiconductor device as claimed in claim 1, wherein said chip carrier further has a plurality of additional leads electrically connected to said leads through via holes formed in the resin substrate.

5. A semiconductor device as claimed in claim 1, wherein said first mold resin portion has no fin.

6. A semiconductor device as claimed in claim 1, wherein said resin substrate has a device hole surrounding said semiconductor element while said leads are divisible into inner leads extended within said device hole on said front surface and outer leads laid on said resin substrate and contiguous to said inner leads;

said first mold resin portion sealing at least said inner leads on said front and said back surfaces in addition to said semiconductor element.

7. A semiconductor device as claimed in claim 2, wherein said first mold resin portion has a first part located on the side of the front surface of the chip carrier and projected from said front surface and a second part located on the side of the back surface of the chip carrier;

said balls being higher than said first part.

8. A semiconductor device as claimed in claim 2, further comprises:

a solder mask surrounding said balls on the side of the front surface of the chip carrier.

9. A semiconductor device as claimed in claim 8, further comprising:

another solder mask formed on the side of the back surface of the chip carrier.

10. A semiconductor device as claimed in claim 3, further comprising:

a heat spreader which has a spreader surface attached to said bottom element surface of the semiconductor element.

11. A semiconductor device as claimed in claim 10, wherein said heat spreader has a spreader side surface which is contiguous to said spreader surface and which has a protusion.

12. A semiconductor element as claimed in claim 6, wherein said second mold resin portion seals said outer leads on the back surface.

* * * * *